(12) United States Patent
Joo

(10) Patent No.: US 9,455,044 B2
(45) Date of Patent: Sep. 27, 2016

(54) SEMICONDUCTOR MEMORY DEVICE PERFORMING PROGRAM AND PROGRAM VERIFY OPERATION ON THE MEMORY CELL ARRAY INCLUDING PASS/FAIL CHECK ON THE PROGRAM OPERATION

(71) Applicant: SK hynix Inc., Gyeonggi-do (KR)

(72) Inventor: Byoung In Joo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/697,419

(22) Filed: Apr. 27, 2015

(65) Prior Publication Data

US 2016/0172050 A1   Jun. 16, 2016

(30) Foreign Application Priority Data

Dec. 11, 2014   (KR) .................. 10-2014-0178426

(51) Int. Cl.
| | | |
|---|---|---|
| G11C 16/04 | (2006.01) | |
| G11C 16/34 | (2006.01) | |
| G11C 16/26 | (2006.01) | |
| G11C 16/14 | (2006.01) | |
| G11C 16/10 | (2006.01) | |

(52) U.S. Cl.
CPC .......... *G11C 16/3459* (2013.01); *G11C 16/14* (2013.01); *G11C 16/26* (2013.01); *G11C 16/10* (2013.01)

(58) Field of Classification Search
CPC .... G11C 16/10; G11C 16/0483; G11C 16/26
USPC ............ 365/185.12, 185.18, 185.11, 185.22
See application file for complete search history.

(56) References Cited

U.S. PATENT DOCUMENTS

| | | | | |
|---|---|---|---|---|
| 2007/0211537 A1* | 9/2007 | Park | ................... | G11C 16/0483 365/185.22 |
| 2008/0056006 A1* | 3/2008 | Jung | ................... | G11C 11/5628 365/185.22 |
| 2010/0306582 A1* | 12/2010 | Han | ................... | G06F 11/1068 714/6.13 |
| 2012/0008402 A1* | 1/2012 | Park | ................... | G11C 16/0483 365/185.18 |
| 2013/0163331 A1* | 6/2013 | Yoo | ................... | G11C 16/3459 365/185.11 |

FOREIGN PATENT DOCUMENTS

KR   1020110001073   1/2011

* cited by examiner

*Primary Examiner* — Connie Yoha
(74) *Attorney, Agent, or Firm* — IP & T Group LLP

(57) ABSTRACT

A semiconductor memory device includes a memory cell array including a plurality of memory cells, a peripheral circuit performing a program pulse applying operation and a verify operation on the memory cell array, a pass/fail check circuit performing a pass/fail check operation on a program operation including the program pulse applying operation and the verify operation, and a control logic controlling the peripheral circuit and the pass/fail check circuit to perform the pass/fail check operation during the program pulse applying operation.

17 Claims, 5 Drawing Sheets

SEMICONDUCTOR MEMORY DEVICE PERFORMING PROGRAM AND PROGRAM VERIFY OPERATION ON THE MEMORY CELL ARRAY INCLUDING PASS/FAIL CHECK ON THE PROGRAM OPERATION

CROSS-REFERENCE TO RELATED APPLICATION

The present application claims priority to Korean patent application number 10-2014-0178426, filed on Dec. 11, 2014, the entire disclosure of which is herein incorporated in its entirety by reference.

BACKGROUND

1. Field of Invention

Various exemplary embodiments relate generally to an electronic device and, more particularly, to a semiconductor memory device and an operating method thereof.

2. Description of Related Art

Semiconductor memory devices are typically categorized into volatile memory devices and non-volatile memory devices.

Non-volatile memory devices operate at relatively slow write and read speeds, but they can retain stored data in the absence of a power supply. Therefore, non-volatile memory devices may be used to store data that needs to be retained regardless of power on/off conditions. Examples of non-volatile memory devices include Read Only Memory (ROM), Mask ROM (MROM), Programmable ROM (PROM), Erasable Programmable ROM (EPROM), Electrically Erasable Programmable ROM (EEPROM), flash memory, Phase-change Random Access Memory (PRAM), Magnetoresistive RAM (MRAM), Resistive RAM (RRAM) and Ferroelectric RAM (FRAM). Flash memories are categorized into NOR and NAND types.

Flash memories enjoy the advantages of both RAM and ROM. For example, flash memories may be freely programmed and erased similar to RAM. Similar to ROM, flash memories may retain stored data even without a power supply. Flash memories have been widely used as the storage media of portable electronic devices such as mobile phones, digital cameras, personal digital assistants (PDAs), and MP3 players.

SUMMARY

An embodiment is directed to a semiconductor memory device capable of reducing program operation times by using a page buffer and improving the reliability of a pass/fail check operation of a program operation.

A semiconductor memory device according to an embodiment of the present invention may include a memory cell array including a plurality of memory cells, a peripheral circuit suitable for performing a program pulse applying operation and a verify operation on the memory cell array, a pass/fall check circuit suitable for performing a pass/fail check operation on a program operation including the program pulse applying operation and the verify operation, and a control logic suitable for controlling the peripheral circuit and the pass/fail check circuit to perform the pass/fail check operation during the program pulse applying operation.

A semiconductor memory device according to an embodiment of the present invention may include a memory cell array including a plurality of memory cells, a voltage generator suitable for applying a program pulse and a verify voltage to the memory cell array during a program pulse applying operation and a verify operation, a plurality of page buffers suitable for controlling potential levels of bit lines of the memory cell array in response to program data during the program pulse applying operation, and sensing program states of selected memory cells, among the plurality of memory cells, during the verify operation, a pass/fail check circuit suitable for performing a pass/fail check operation on a program operation including the program pulse applying operation and the verify operation and a control logic suitable for controlling the pass/fail check circuit to perform the pass/fail check operation during the program pulse applying operation.

An operating method of a semiconductor memory device according to an embodiment of the present invention may include applying a program pulse to a selected memory cell, among a plurality of memory cells, performing a verify operation on the selected memory cell by sensing data of the selected memory cell, resetting the program pulse and applying the reset program pulse to the selected memory cell, based on a result of the verify operation, and performing a pass/fail check operation using the data sensed during the verify operation, in the applying of the reset program pulse.

DETAILED DESCRIPTION

Figure 1:
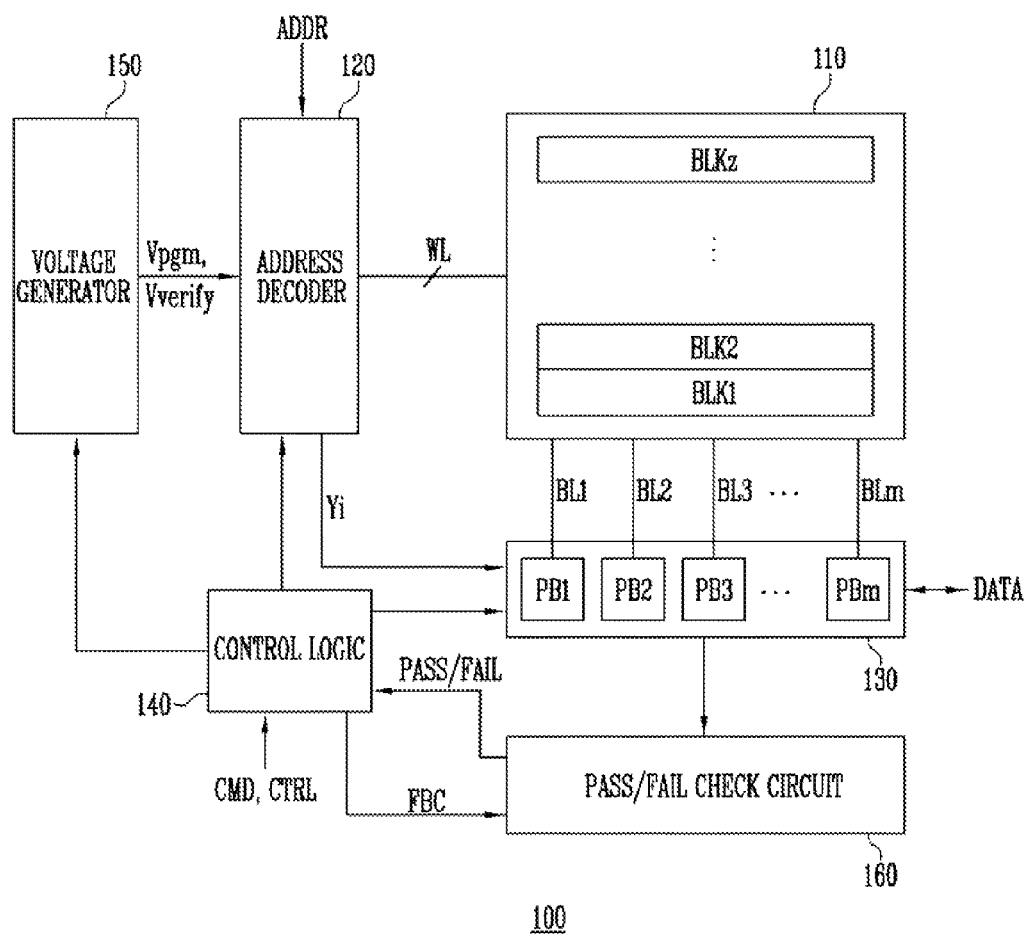
FIG. 1 is a block diagram illustrating a semiconductor memory device according to an embodiment.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity, conciseness of explanation, and to avoid obscuring the concept of the present invention. Like reference numerals refer to like elements throughout the specification and drawings.

Furthermore, 'connected/coupled' represents that one component is directly coupled to another component or coupled to another component through an Intervening component. A singular form may include a plural form as long as it is not specifically mentioned. Furthermore, 'include/comprise' or 'including/comprising' used in the specification represents that one or more components, steps, operations, and elements may exist or be added.

FIG. 1 is a block diagram illustrating a semiconductor memory device according to an embodiment.

Referring to FIG. 1, a semiconductor memory device 100 may include a memory cell array 110, an address decoder 120, a read and write circuit 130, a control logic 140, a voltage generator 150 and a pass/fail check circuit 160.

The memory cell array 110 may include a plurality of memory blocks BLK1 to BLKz. The plurality of memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In one embodiment, the plurality of memory cells may be non-volatile memory cells. Memory cells coupled to the same word line, among the plurality of memory cells, may be defined as a single page. In other words, the memory cell array 110 may include a plurality of pages.

The address decoder 120, the read and write circuit 130 and the voltage generator 150 may function as a peripheral circuit for driving the memory cell array 110.

The address decoder 120 may be coupled to the memory cell array 110 through the word lines WL. The address decoder 120 may be controlled by the control logic 140. The address decoder 120 may receive an address ADDR through an input/output buffer (not illustrated) in the semiconductor memory device 100.

The address decoder 120 may apply a program pulse Vpgm generated by the voltage generator 150 to a selected word line, among word lines of a selected memory block, when a program pulse applying operation is performed during a program operation. The address decoder 120 may apply a verify voltage Vverify generated by the voltage generator 150 to the selected word line, among the word lines of the selected memory block, when a verify operation is performed during the program operation.

A program operation of the semiconductor memory device 100 may be performed on the basis of pages. The address ADDR received in response to a request for a program operation may include a block address, a row address and a column address. The address decoder 120 may select one of the memory blocks and one of the word lines in response to the block address and the row address. The column address may be decoded by the address decoder 120 and provided to the read and write circuit 130.

The read and write circuit 130 may include a plurality of page buffers PB1 to PBm. The plurality of page buffers PB1 to PBm may be coupled to the memory cell array 110 through the bit lines BL1 to BLm. Each of the page buffers PB1 to PBm may temporarily store data DATA, which is provided from an external device, during the program operation, and set a potential level of the corresponding bit line to a program permission voltage or a program inhibition voltage in response to the stored data DATA. In addition, the plurality of page buffers PB1 to PBm may each sense a program state of the corresponding memory cell and verify the program operation on the basis of the program state during a verify operation.

The read and write circuit 130 may be controlled by the control logic 140.

According to an exemplary embodiment, the read and write circuit 130 may include page buffers (or page registers) and a column selection circuit.

The control logic 140 may be coupled to the address decoder 120, the read and write circuit 130 and the voltage generator 150. The control logic 140 may receive a command CMD through the input/output buffer (not illustrated) of the semiconductor memory device 100. The control logic 140 may be configured to control the overall operation of the semiconductor memory device 100 in response to the command CMD. In addition, the control logic 140 may control the voltage generator 150 and the address decoder 120 so that the program pulse Vpgm or the verify voltage Vverify may be applied to the selected memory block during the program operation of the memory cell array 110. The control logic 140 may control the read and write circuit 130 so that program and verify operations may be performed by controlling and sensing the potentials of the bit lines BL1 to BLm of the memory cell array 110. In addition, the control logic 140 may control the pass/fail check circuit 160 to output a fail bit count signal FBC and perform a pass/fail check operation by using data sensed during the previous verify operation when the program pulse applying operation is performed. In addition, the control logic 140 may control the pass/fail check circuit 160 to selectively perform a current measuring method and a data counting method during the pass/fail check operation to thereby improve the reliability of the pass/fail check operation.

The voltage generator 150 may generate the program pulse Vpgm to be applied to the selected memory block during the program pulse applying operation and the verify voltage Vverify to be applied to the selected memory block during the program verify operation.

The pass/fail check circuit 160 may output a program pass/fail signal PASS/FAIL by counting the number of fail bits of memory cells in which a program error occurs, among the plurality of memory cells, in response to the fail bit count signal FBC during the program pulse applying operation. The pass/fail check circuit 160 may output a fail signal FAIL when the number of fail bits counted is greater than the number of allowable bit errors that are correctable using an error correction code, and output a pass signal PASS when the number of fail bits that are counted is smaller than the number of allowable bit errors.

The pass/fail check circuit 160 may perform the pass/fail check operation by using sensing data stored in the page buffers of the read and write circuit 130 during the program pulse applying operation. The pass/fail check circuit 160 may selectively perform a current sensing method and a data counting method. According to the current sensing method, the amount of current corresponding to the sensing data stored in the page buffers may be measured to estimate the number of fail bits. According to the data counting method, a logic value of the sensing data stored in the page buffers may be counted to determine the counted logic value as the number of fail bits. In addition, the pass/fail check circuit 160 may output the program pass/fail signal PASS/FAIL by using the number of fail bits obtained by using the current sensing method and the number of fail bits obtained by using the data counting method so that the pass/fail check circuit 160 may improve the accuracy of counting the number of fail bits.

Figure 2:
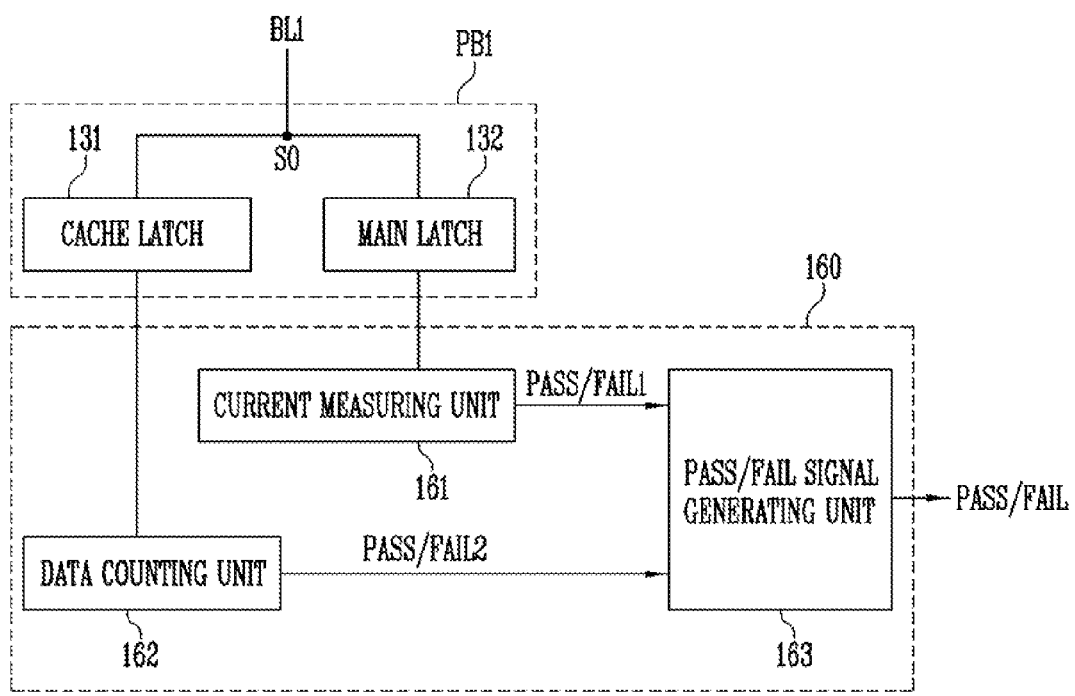
FIG. 2 is a block diagram illustrating a page buffer and a pass/fail check circuit shown in FIG. 1.

FIG. 2 is a block diagram illustrating a page buffer and a pass/fail check circuit shown in FIG. 1.

FIG. 2 illustrates one of the page buffers shown in FIG. 1, i.e., the page buffer PB1 coupled to the pass/fail check circuit 160. However, in actuality, the plurality of page buffers PB1 to PBm included in the read and write circuit 130 may be coupled to the pass/fail check circuit 160, like the page buffer PB1. In addition, each of the page buffers PB1 to PBm may have substantially the same configuration as the page buffer PB1.

Referring to FIG. 2, the page buffer PB1 may include a main latch 132 and a cache latch 131. The main latch 132 and the cache latch 131 may be coupled to the corresponding bit line BL1 through a sensing node SO. In addition, the main latch 132 and the cache latch 131 may transfer the latched data through the sensing node SO.

For example, program data which is inputted to the cache latch 131 for a cache operation during the program operation may be transferred to the main latch 132. When a potential level of the sensing node SO is set to a program permission voltage or a program inhibition voltage, in response to the program data stored in the main latch 132, the next program data may be inputted to the cache latch 131.

During a verify operation, the page buffer PB1 may latch sensing data in response to a program state of a selected memory cell by using the main latch 132 and verify the program operation by using the latched sensing data.

In addition, during the pass/fail check operation, the sensing data stored in the main latch 132 may be transferred to the cache latch 131, and the data stored in the cache latch 131 may be outputted to the pass/fail check circuit 160. The sensing data stored in the main latch 132 may be inverted and transferred to the cache latch 131.

The pass/fail check circuit 160 may include a current measuring unit 161, a data counting unit 162 and a pass/fail signal generation unit 163.

The current measuring unit 161 may estimate the number of fail bits on the basis of a current value corresponding to the sensing data stored in the main latch 132 of each of the page buffers PB1 to PBm. In addition, the data measuring unit 161 may output a first pass/fail signal PASS/FAIL1 in response to the estimated number of fail bits.

The data counting unit 162 may determine the number of fail bits by counting the number of first data (for example, "0") or second data (for example, "1"), among the data stored in the cache latch 131 of each of the page buffers PB1 to PBm, and output a second pass/fail signal PASS/FAIL2 in response to the determined number of fail bits.

The pass/fail signal generation unit 163 may output the program pass/fail signal PASS/FAIL by using the first pass/fail signal PASS/FAIL1 outputted from the current measuring unit 161 or the second pass/fail signal PASS/FAIL2 outputted from the data counting unit 162. The pass/fail signal generation unit 163 may include a multiplexer and selectively output one of the first pass/fail signal PASS/FAIL1 and the second pass/fail signal PASS/FAIL2 as the program pass/fail signal PASS/FAIL.

Figure 3:
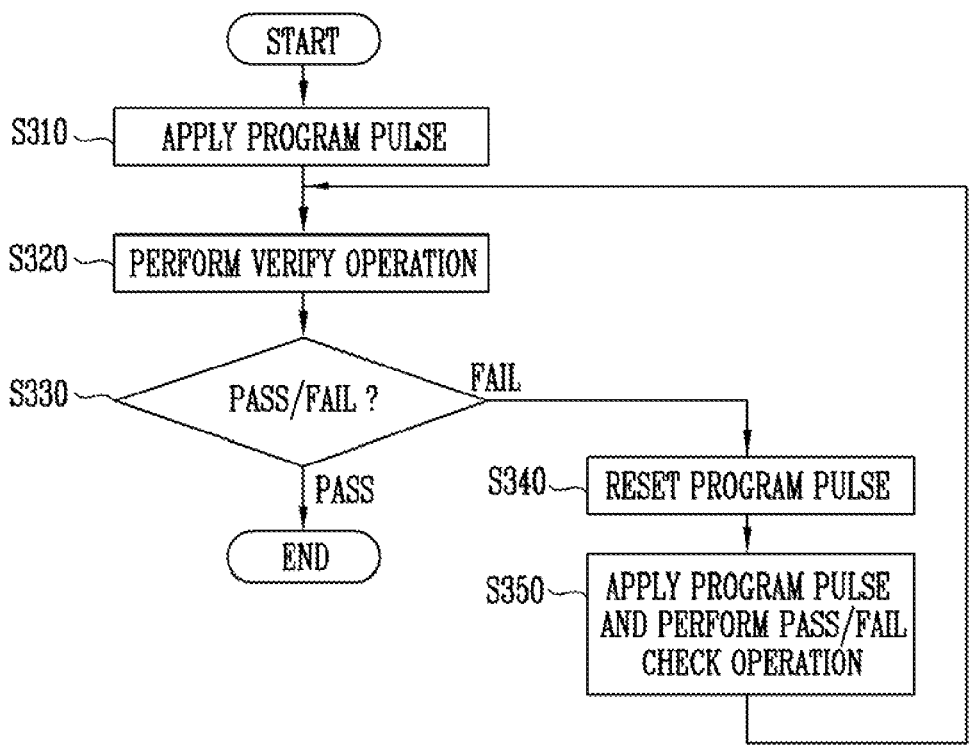
FIG. 3 is a flowchart illustrating operations of a semiconductor device according to an embodiment.

FIG. 3 is a flowchart illustrating operations of a semiconductor memory device according to an embodiment.

Figure 4:
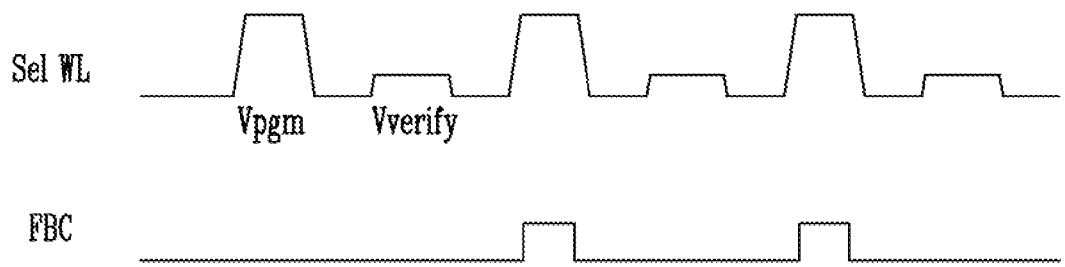
FIG. 4 is a waveform diagram of voltages and signals for Illustrating operations of a semiconductor memory device according to an embodiment.

FIG. 4 is a waveform diagram of voltages and signals for illustrating operations of a semiconductor memory device according to an embodiment.

An operating method of a semiconductor memory device is described below with reference to FIGS. 1 to 4.

1) Apply program pulse (S310)

The plurality of page buffers PB1 to PBm may set potential levels of the bit lines BL1 to BLm to the program permission voltage or the program Inhibition voltage based on the temporarily stored program data.

When the program pulse applying operation is performed during the program operation, the address decoder 120 may select one of the memory blocks BLK1 to BLKz in response to the address ADDR, and apply the program pulse Vpgm generated by the voltage generator 150 to the selected word line in the selected memory block.

2) Perform verify operation (S320)

After the program pulse applying operation (S310), the verify voltage Vverify generated by the voltage generator 150 may be applied to the selected word line of the selected memory block, and the page buffers PB1 to PBm may sense the potential levels of the bit lines BL1 to BLm corresponding thereto and store the sensing data in the main latch 132 to thereby perform a program verify operation.

3) Determine verify result (S330)

When, as a result of the above-described verify operation (S320), it is determined that threshold voltages of target program memory cells are greater than the verify voltage Vverify, a program pass may be determined. When the threshold voltage of at least one of the target program memory cells is lower than the verify voltage Vverify, a program fall may be determined.

4) Reset program pulse (S340)

When a program fail is determined at the above-described verify result determining operation (S330), the control logic 140 may control the voltage generator 150 to reset the program pulse Vpgm by increasing the program pulse Vpgm by a step voltage.

The plurality of page buffers PB1 to PBm may transfer data, which is sensed in the main latch 132 during the above-described verify operation (S320), to the cache latch 131 to be stored therein.

5) Apply program pulse and perform pass/fail check operation (S350)

After the above-described program pulse resetting operation (S340), the address decoder 120 may select one of the memory blocks BLK1 to BLKz in response to the address ADDR and apply the program pulse Vpgm reset by the voltage generator 150 to the selected word line in the selected memory block.

At the same time, the pass/fail check circuit 160 may determine the number of fail bits by counting the data stored in the cache latch 131 of each of the page buffers PB1 to PBm and output the program pass/fail signal PASS/FAIL to the control logic 140.

The control logic 140 may determine the selected memory block as a normal memory block or a bad memory block in response to the program pass/fail signal PASS/FAIL and perform subsequent operations.

Figure 5:
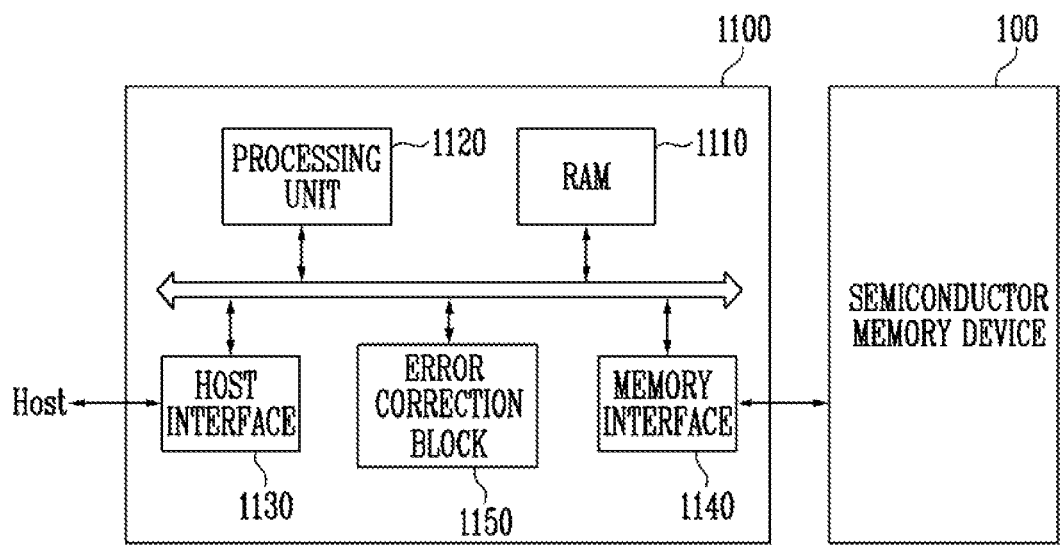
FIG. 5 is a block diagram illustrating a memory system including a semiconductor memory device shown in FIG. 1.

FIG. 5 is a block diagram illustrating a memory system 1000 including the semiconductor memory device 100 shown in FIG. 1.

Referring to FIG. 5, the memory system 1000 may include the semiconductor memory device 100 and a controller 1100.

The semiconductor memory device 100 may be configured and operated in substantially the same manner as described above with reference to FIG. 1. Thus, a detailed description thereof will be omitted.

The controller 1100 may be coupled to a host and the semiconductor memory device 100. The controller 1100 may access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140 and an error correction block 1150. The RAM 1110 may be used as an operation memory of the processing unit 1120, a cache memory between the semiconductor memory device 100 and the host, and/or a buffer memory between the semiconductor memory device 100 and the host. The processing unit 1120 may control operations of the controller 1100.

The host interface 1130 may include a protocol for exchanging data between the host and the controller 1100. For example, the controller 1100 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface 1140 may include a NAND flash interface or a NOR flash interface.

The error correction block 1150 may detect and correct errors in data read from the semiconductor memory device 100 by using an error correction code (ECC). The processing unit 1120 may control the semiconductor memory device 100 to control a read voltage based on an error direction result of the error correction block 1150 and perform a read operation again. According to an exemplary embodiment, the error correction block 1150 may be provided as a component of the controller 1100.

The controller 1100 and the semiconductor memory device 100 may be Integrated in one semiconductor device. According to an exemplary embodiment, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 6:
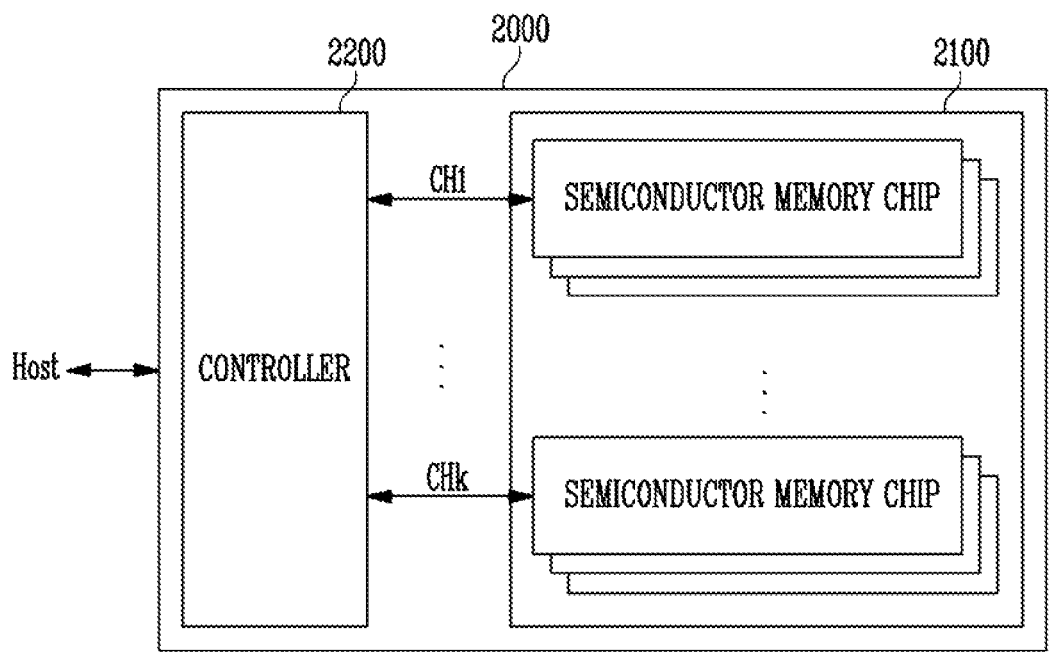
FIG. 6 is a block diagram illustrating an applied example of a memory system shown in FIG. 5.

FIG. 6 is a block diagram illustrating an application example 2000 of the memory system 1000 shown in FIG. 5.

Referring to FIG. 6, a memory system 2000 may include a semiconductor memory device 2100 and a controller 2200. The semiconductor memory device 2100 may include semiconductor memory chips. The semiconductor memory chips may be divided into groups.

FIG. 6 illustrates the semiconductor memory chip groups communicating with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1100 described with reference to FIG. 5, and configured to control the plurality of semiconductor memory chips of the semiconductor memory device 2100.

Figure 7:
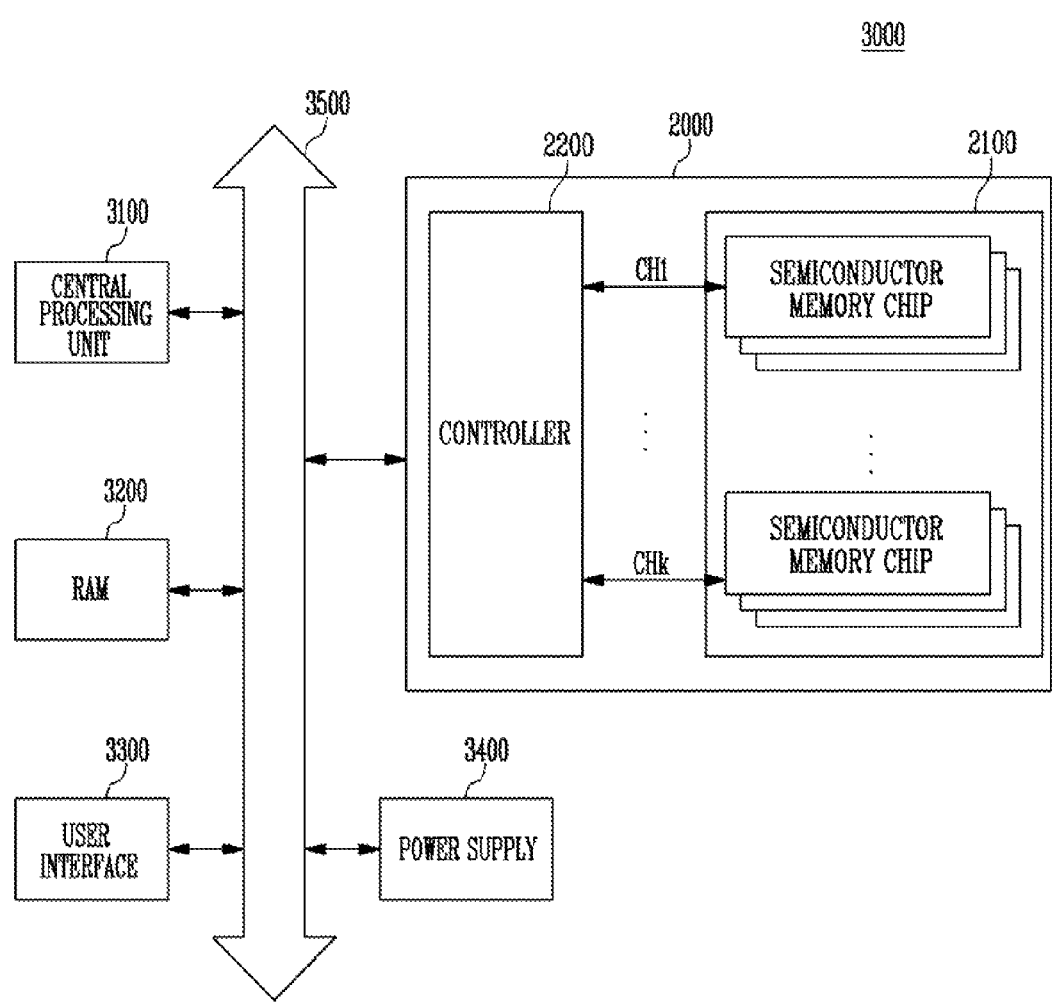
FIG. 7 is a block diagram Illustrating a computing system including a memory system described with reference to FIG. 6.

FIG. 7 is a block diagram Illustrating a computing system 3000 having the memory system 2000 described above with reference to FIG. 6.

Referring to FIG. 7, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 7, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As Illustrated in FIG. 7, the computing system 3000 may include the memory system 2000 shown in FIG. 6. However, the memory system 2000 may be replaced with the memory system 1000 shown in FIG. 5. According to an embodiment, the computing system 3000 may include both of the memory systems 1000 and 2000 described above with reference to FIGS. 5 and 6.

According to an embodiment, a semiconductor memory device may reduce program operation time by using a page buffer and improve reliability of pass/fail check operations of the program operation.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:
1. A semiconductor memory device, comprising:
   a memory cell array including a plurality of memory cells;

a peripheral circuit suitable for performing a program pulse applying operation and a verify operation on the memory cell array;

a pass/fail check circuit suitable for performing a pass/fail check operation on a program operation including the program pulse applying operation and the verify operation; and a control logic suitable for controlling the peripheral circuit and the pass/fail check circuit to perform the pass/fail check operation during the program pulse applying operation, wherein the peripheral circuit includes:

a plurality of page buffers suitable for controlling potential levels of bit lines of the memory cell array in response to program data during the program pulse applying operation, and temporarily storing sensing data of selected memory cells, among the plurality of memory cells, by sensing the potential levels of the bit lines during the verify operation, wherein each of the page buffers outputs the sensing data to the pass/fail check circuit during the pass/fail check operation, wherein the pass/fail check circuit comprises:

a current measuring unit suitable for measuring a current value corresponding to first sensing data to determine a first number of fail bits, and outputting a first pass/fail signal on the basis of the first number of fail bits;

a data counting unit suitable for counting first data or second data, among second sensing data, to determine a second number of fail bits, and outputting a second pass/fail signal on the basis of the second number of fail bits; and a pass/fail signal generation unit suitable for outputting the first pass/fail signal or the second pass/fail signal as a program pass/fail signal to the control logic, wherein the sensing data of selected memory cells are stored in main latches of the plurality of pages buffers as the first sensing data and transferred to and stored in cache latches of the plurality of pages buffers as the second sensing data.

2. The semiconductor memory device of claim 1, wherein each of the plurality of page buffers includes:

a main latch suitable for storing sensing data in response to a program state of one of the selected memory cells during the verify operation; and a cache latch suitable for receiving and temporarily storing the sensing data stored in the main latch and outputting the sensing data to the pass/fail check circuit during the pass/fail check operation.

3. The semiconductor memory device of claim 1, wherein the pass/fail check circuit counts a number of fail bits by using a current sensing method or a data counting method to perform the pass/fail check operation.

4. The semiconductor memory device of claim 1, wherein the pass/fail check circuit performs the pass/fail check operation during the program pulse applying operation, which is performed after a first verify operation.

5. The semiconductor memory device of claim 1, wherein the control logic determines a selected memory block in the memory cell array as a normal or bad memory block based on a result of the pass/fail check operation.

6. A semiconductor memory device, comprising:

a memory cell array including a plurality of memory cells;

a voltage generator suitable for applying a program pulse and a verify voltage to the memory cell array during a program pulse applying operation and a verify operation;

a plurality of page buffers suitable for controlling potential levels of bit lines of the memory cell array in response to program data during the program pulse applying operation, and sensing program states of selected memory cells, among the plurality of memory cells, during the verify operation;

a pass/fail check circuit suitable for performing a pass/fail check operation on a program operation including the program pulse applying operation and the verify operation; and a control logic suitable for controlling the pass/fail check circuit to perform the pass/fail check operation during the program pulse applying operation, wherein the pass/fail check circuit comprises:

a current measuring unit suitable for measuring a current value corresponding to first sensing data stored in main latches of the plurality of page buffers to determine a first number of fail bits, and outputting a first pass/fail signal on the basis of the first number of fail bits;

a data counting unit suitable for counting first data or second data, among second sensing data outputted from cache latches of the plurality of page buffers, to determine a second number of fail bits, and outputting a second pass/fail signal on the basis of the second number of fail bits; and a pass/fail signal generation unit suitable for outputting the first pass/fail signal or the second pass/fail signal as a program pass/fail signal to the control logic.

7. The semiconductor memory device of claim 6, wherein each of the plurality of page buffers outputs data sensed during the verify operation to the pass/fail check circuit during the pass/fail check operation.

8. The semiconductor memory device of claim 7, wherein each of the plurality of page buffers includes:

a main latch suitable for storing sensing data in response to a program state of one of the selected memory cells during the verify operation; and a cache latch suitable for receiving and temporarily storing the sensing data stored in the main latch and outputting the sensing data to the pass/fail check circuit during the pass/fail check operation.

9. The semiconductor memory device of claim 6, wherein the pass/fail check circuit performs the pass/fail check operation by counting a number of fail bits by using a current sensing method or a data counting method.

10. The semiconductor memory device of claim 6, wherein the pass/fail check circuit performs the pass/fail check operation during the program pulse applying operation, which is performed after a first verify operation.

11. The semiconductor memory device of claim 6, wherein the control logic determines a selected memory block in the memory cell array as a normal or bad memory block based on a result of the pass/fail check operation.

12. An operating method of a semiconductor memory device, the operating method comprising:

applying a program pulse to a selected memory cell, among a plurality of memory cells;

performing a verify operation on the selected memory cell by sensing data of the selected memory cell;

resetting the program pulse and applying the reset program pulse to the selected memory cell, based on a result of the verify operation; and performing a pass/fail check operation using the data sensed during the verify operation, in the applying of the reset program pulse, wherein the performing the pass/fail check operation comprises measuring a current value corresponding to first sensing data stored in main latches of a plurality of page buffers to determine a first number of fail bits;

outputting a first pass/fail signal on the basis of the first number of fail bits;

counting first data or second data, among second sensing data outputted from cache latches of the plurality of page buffers, to determine a second number of fail bits;

outputting a second pass/fail signal on the basis of the second number of fail bits; and outputting the first pass/fail signal or the second pass/fail signal as a program pass/fail signal to the control logic.

13. The operating method of claim 12, wherein the performing of the pass/fail check operation includes:

counting a number of fail bits by a current sensing method or a data counting method.

14. The operating method of claim 12, wherein when a program operation is determined to have failed as the result of the verify operation, the resetting of the program pulse and the applying of the reset program pulse are performed.

15. The operating method of claim 12, further comprising:

reperforming the verify operation, after the resetting of the program pulse and the applying of the reset program pulse.

16. The operating method of claim 15, wherein the resetting of the program pulse, the applying of the reset program pulse, and the reperforming of the verify operation are repeated, until the program operation is determined to have passed as the result of the verify operation.

17. The operating method of claim 12, further comprising:

determining a memory block including the plurality of memory cells as a normal or bad memory block based on a result of the pass/fail check operation.

\* \* \* \* \*